United States Patent

Sprintschnik et al.

[11] 4,339,530
[45] Jul. 13, 1982

[54] DEVELOPER MIXTURE FOR DEVELOPING EXPOSED LIGHT-SENSISTIVE COPYING LAYERS

[75] Inventors: Gerhard Sprintschnik, Hofheim-Wallau; Rudolf Neubauer, Erbach; Gerhard Buhr, Königstein, all of Fed. Rep. of Germany

[73] Assignee: Hoechst Aktiengesellschaft, Fed. Rep. of Germany

[21] Appl. No.: 196,279

[22] Filed: Oct. 14, 1980
(Under 37 CFR 1.47)

[30] Foreign Application Priority Data

Oct. 17, 1979 [DE] Fed. Rep. of Germany ....... 2941960

[51] Int. Cl.³ .................... G03C 5/24; G03C 7/02
[52] U.S. Cl. .................... 430/331; 430/302; 430/309; 430/493; 430/634; 430/638
[58] Field of Search ............. 430/331, 302, 493, 634, 430/638, 309

[56] References Cited

U.S. PATENT DOCUMENTS 3,284,429 11/1966 Fuchs et al.
4,186,006 1/1980 Kobayashi et al. ................. 430/331

FOREIGN PATENT DOCUMENTS 2364631 7/1974 Fed. Rep. of Germany ...... 430/331
2809774 9/1979 Fed. Rep. of Germany ...... 430/331
1082016 9/1967 United Kingdom .
1523877 9/1978 United Kingdom .

*Primary Examiner*—Charles L. Bowers
*Attorney, Agent, or Firm*—James E. Bryan

[57] ABSTRACT

This invention relates to a developer mixture for washing out light-sensitive copying layers previously exposed in imagewise manner and containing a polymer of an N-vinyl amine, of vinyl alcohol or of a vinyl alcohol derivative, an alcohol being water-soluble in an amount less than 10% by weight, and water as the main constituent, the mixture containing as said polymer a copolymer which is water-soluble or which can be dispersed in water to form a stable dispersion, composed of (a) hydrophilic units of the formula I:

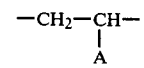

wherein A is O-R or

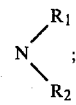

R is a hydrogen atom or a methyl group; $R_1$ is a hydrogen atom, an alkyl group or an alkoxy alkyl group having 1 to 10 carbon atoms each or an aryl group with 6 to 10 carbon atoms; $R_2$ is an alkyl group or an acyl group having 1 to 5 carbon atoms each, and wherein a homopolymer of the hydrophilic units is water-soluble and of (b) hydrophobic units of vinyl monomers whose homopolymer is water-insoluble and which have an aromatic or a long-chain aliphatic group as the substituent, the proportion of the hydrophobic units being sufficient to ensure that an 0.1% aqueous solution of said copolymer has a surface tension of not more than 50 mN/m and that the quantity of said copolymer is at least sufficient to emulsify any quantity of alcohol exceeding the solubility limit. The invention also relates to a process for developing exposed light-sensitive copying layers using said developer mixture.

5 Claims, No Drawings

DEVELOPER MIXTURE FOR DEVELOPING EXPOSED LIGHT-SENSISTIVE COPYING LAYERS

This invention relates to a developer mixture for developing, possibly fixing, and preserving exposed light-sensitive layers, especially of presensitized lithographic printing plates. In general, such layers are made of a light-sensitive constituent (diazonium salt condensate, ethylenically unsaturated compound, azide or the like), and of a polymeric water-insoluble binder which in most cases is not light-sensitive and which gives the copying layer good printing characteristics.

Layers containing water-insoluble binders, especially binders which are insoluble in acid or alkaline aqueous solutions, can after their imagewise exposure to light in most cases be developed only by using developer liquids which contain relatively large quantities of low-boiling, toxic, inflammable and malodorous organic solvents. The processing of such developers leads to considerable ecological problems and often requires special equipment for removing the vapors and the spent developers.

The mode of action of a solvent-containing developer is that the unhardened binder is caused to swell by the solvent whereby a more or less mechanical removal is made possible. However, the swollen polymer particles quite often immediately adhere to each other and form macroscopically visible cakes which then adhere to already developed parts of the plate and thus may cover solid or fine halftone areas of the developed plate, a process which in practice is called redeposition. Thereby, the quality of the printing plate is reduced, and it even may become unusable for printing. Processing in developing machines often makes necessary the installation of special filtering systems where the cakes are filtered out to prevent the adherence of rolls. In general, cake formation and redeposition can be avoided by increasing the quantity of solvent in the developer, which brings about the disadvantages mentioned above, however.

German Offenlegungsschrift No. 2,364,631, discloses developers for layers containing water-insoluble polymers. These developers preferably contain benzyl alcohol as a solving agent. They work quite efficiently on the special copying layers mentioned therein, but in general they are not suited for a more universal use on various types of printing plates. Here, too, attempts have been made to increase the content of benzyl alcohol beyond its water solubility limit by adding solubilizing, generally low-boiling solvents or wetting agents. It shows, however, that the addition of greater quantities of wetting agents causes foaming of the solution, whereby its usefulness in automatic processing machines which, e.g., work with sprayers, is adversely influenced.

German Offenlegungsschrift No. 2,809,774, discloses aqueous developer solutions for layers of diazonium salt polycondensation products and water-insoluble polymers containing anionic wetting agents, poly-N-vinyl-N-methyl acetamide or polyvinyl alcohol, buffer salts, benzyl alcohol and glycerol triacetate. These developers are also well-suited for special layers. Their content of solvents is limited, however, and they have a tendency to foam when they contain a relatively high amount of wetting agents.

It is the object of the present invention to provide a developer which 1. is free from highly toxic, malodorus, low-boiling solvents,
2. contains solvents which are practically odorless or at least are not malodorous, and are biologically acceptable,
3. is applicable for a great number of various binder systems, as they are used for printing plates delivering a high number of prints,
4. rapidly develops the printing plate, without cake formation and redeposition, and with a low developer consumption, and
5. does not foam excessively in automatic developing machines.

The invention describes a developer mixture for developing exposed light-sensitive copying layers, which developer contains a polymer of an N-vinyl amine, of vinyl alcohol or of a vinyl alcohol derivative, an alcohol which is soluble in water in an amount less than 10 percent by weight, and water as its main constituent.

The developer mixture according to the present invention contains as said polymer a water-soluble copolymer or a copolymer which in water can be dispersed to form a stable dispersion comprising (a) a hydrophilic unit of the formula I

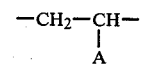

wherein
A is O-R or

R is a hydrogen atom or a methyl group,
$R_1$ is a hydrogen atom, an alkyl group with 1 to 10 carbon atoms or an alkoxyalkyl group with 2 to 10 carbon atoms, or an aryl group with 6 to 10 carbon atoms, and
$R_2$ is an alkyl group or an acyl group with 1 to 5 carbon atoms each,
whose homopolymers are water-soluble, and (b) hydrophobic units of vinyl monomers whose homopolymers are water-insoluble, and which have aromatic or long-chain aliphatic groups as substituents, the proportion of the hydrophobic units being such that an 0.1 percent by weight aqueous solution of the copolymer has a surface tension of not more than 50 mN/m and the quantity of the copolymer being at least sufficient to emulsify the quantity of alcohol exceeding the solubility limit, which possibly may be present.

The copolymers of hydrophilic and hydrophobic units contained in the developer mixtures according to this invention either are soluble in water, e.g. to 5–10 percent by weight, or they can be dispersed to form a stable dispersion in water, without adding dispersing or emulsifying agents.

The hydrophilic units must be such that their homopolymers are water-soluble. In addition to these and to the hydrophobic units, the polymers also may contain small quantities, e.g. up to 10 percent by weight, of other units which form water-insoluble homopolymers, but do not substantially reduce the surface tension, e.g. units of vinyl acetate or lower alkylacrylates.

The proportion of hydrophilic monomers must be at least sufficiently high to guarantee the solubility, respectively the dispersability in water indicated above.

Vinyl amine derivatives are preferably used as the hydrophilic units in the formula given above. Those are preferred wherein $R_2$ is an acyl group having 1 to 4 carbon atoms.

$R_1$ preferably is hydrogen or an alkyl group having 1 to 5 carbon atoms.

The preferred hydrophobic units are those which are derived from alkyl esters of unsaturated carboxylic acids having 4 to 30, preferably 6 to 20, carbon atoms in their alkyl groups, from vinyl aromatic compounds or from vinyl alkyl esters having 4 to 30, preferably 6 to 20, carbon atoms in their alkyl groups. Of the unsaturated carboxylic acids, acrylic acid, methacrylic acid and maleic acid are preferably used. In general the proportion of hydrophobic monomer units in the copolymer is between 0.5 and 25 percent per mole.

The preparation of suitable copolymers is, e.g., described in U.S. Pat. No. 3,284,429, British Pat. No. 1,082,016, and German Offenlegungsschrift No. 1,720,793.

The molecular weight of the copolymers has no decisive influence on their effectiveness. In general it should be at least 1,000, but preferably is between about 5,000 and 200,000.

Examples of monomers forming suitable hydrophobic units are Versatic ® acid vinyl ester, isononaoic acid vinyl ester, maleic acid dihexyl ester, ethyl hexyl acrylate, decyl methacrylate, lauryl acrylate, styrene and 4-octyl styrene.

The copolymers are advantageously added to the developer mixture in quantities from 0.5 to 10 percent by weight, preferably from 2 to 7 percent by weight. The upper limit is reached when the viscosity of the finished solutions becomes too high. The viscosity should not exceed a value of 0.2 cm$^2$/s at 25° C., measured by the Ubbelohde method.

Small quantities (0.1 to 5% by weight) of other water-soluble polymeric substances also may be added to the developer, e.g., cellulose ethers such as methyl cellulose, carboxy methyl cellulose, hydroxy alkyl cellulose, salts and esters of alginic acid, polyvinyl lactams, e.g. polyvinyl pyrrolidone and its copolymers with vinyl acetate, polyacrylic acid amide, polyvinyl acetidinone, polyvinyl alcohol, and water-soluble homopolymers and copolymers of N-vinyl-N-methyl acetamide, which do not reduce the surface tension of water to the indicated degree. In the developer, these polymers must, of course, be compatible with the other constituents at the respective pH values.

Another essential component part of the developer mixture is at least one preferably monovalent alcohol which is water-soluble to less than about 10 percent by weight, preferably to less than about 2 percent by weight. It has been found that araliphatic or cycloaliphatic alcohols are best suited, e.g. 1-phenyl ethanol, 2-phenyl ethanol, 3-phenyl propanol-1, 4-phenyl butanol-1, 4-phenyl butanol-2, 2-phenyl butanol-1, 2-phenoxy ethanol, 2-benzyloxy ethanol, o-methoxy benzyl alcohol, m-methoxy benzyl alcohol, p-methoxy benzyl alcohol, benzyl alcohol, cyclohexanol, 2-methyl cyclohexanol, 4-methyl cyclohexanol and 3-methyl cyclohexanol.

Aliphatic, and especially longer-chain alcohols also may be used, but these are not as effective as the araliphatic alcohols. Of the aliphatic alcohols, primary alcohols are more suitable than secondary or tertiary alcohols. Examples are butanol-1, octanol-1, ethylene glycol monohexyl ether, octanol-2, octanol-4, 2-ethyl hexanol, ethyl hexyl carbinol, citronellol, and geraniol.

Probably the mode of action of the developer is that the sparingly water-soluble alcohol is solubilized by the copolymer. Thus it is possible to solubilize, or to emulsify, sparingly water-soluble alcohols in water in quantities which are greater than necessary for a technically perfect developer. For example, the water-solubility of octanol-1 and 2-phenoxy ethanol is less than 1 percent by weight, or less than 2 percent at room temperature, whereas in the presence of just 5 percent by weight of a copolymer composed of 9 moles of N-vinyl-N-methyl acetamide and 1 mole of bis-(2-ethyl hexyl)-maleinate they are emulsifiable in water in practically unlimited quantities, whereby stable emulsions are formed which do not separate even after a storage time of several months.

In general, the amount of alcohols added to the developer ranges from 1 to 15 percent by weight, preferably from 2.5 to 10 percent by weight. In some cases effective developers may be obtained with an alcohol proportion below the solubility limit. The optimum effectiveness is reached, however, when the amount of added alcohol exceeds the solubility limit and the excess quantity is emulsified.

Due to their composition, the appearance of the developers in most cases is opaque to milky—not transparent. To optimize their properties, they may additionally contain wetting agents, salts, plasticizers, acids, alkalies, perfumes, the above-mentioned water-soluble polymers and other organic solvents. The quantities must always be such, however, that the individual component parts remain compatible with one another and that no precipitations or phase separations occur.

Of the wetting agents, anionic ones, e.g. sodium lauryl sulfate, sodium octyl sulfate, sodium salts of correspondingly substituted sulfosuccinic acid esters, sodium isopropyl naphthalene sulfonate, sodium oleic acid sarcoside, sodium oleic acid isethionate, sodium oleic acid methyl tauride, sodium fatty alcohol polyglycol ether sulfate, sodium fatty alkyl phenol polyglycol ether sulfate, sodium fatty olefin sulfonate, sodium fatty alkyl phenol sulfonate or mixtures thereof, and cationic ones, e.g., N-cetylpyridinium chloride, trimethyl stearyl ammonium halogenides and fatty alkyl benzyl dimethyl ammonium chloride are preferred. Non-ionogenic surfactants, e.g., alkyl phenol polyglycol ether or fatty alcohol polyglycol ether also may be used, however. These surfactants provide for an additional stabilization of the emulsion, even if it contains a relatively small quantity of emulsifying copolymers only. The quantity of surfactants should be kept small enough to avoid foaming of the emulsion under developing conditions. In general it varies between 0.05 and 5 percent by weight.

Salts which can be added are, e.g., water-soluble phosphates, sulfates, chlorides, nitrates, silicates, carbonates, borates, acetates and benzoates of alkali metals and alkaline-earth metals. In general the quantity thereof amounts to between 0.1 and 10 percent by weight.

Acids which can be added are, e.g., phosphoric acid, tartaric acid, p-toluene sulfonic acid and citric acid in amounts ranging from 0.1 to 8 percent by weight.

Other frequently used organic solvents differing from the above alcohols are higher-boiling polar solvents, i.e., solvents whose boiling points are at least within the same range as that of the alcohol. Suitable solvents include solvents which are water-soluble to more than 10 percent by weight, e.g. polyvalent alcohols and their partial ethers and esters, and corresponding derivatives of the glycolic acids and triethanol amine. Further, water-insoluble solvents which do not contain hydroxy groups, e.g., completely etherified or esterified monovalent or preferably polyvalent alcohols, such as glycerol triacetate, phthalic acid dibutyl ester and dialkyl ester of ethylene glycol are suitable. Of these organic solvents, the optionally at least partly etherified or esterified polyvalent alcohols are preferred. In general, an amount of between 0.1 and 10 percent by weight, preferably of between 2 and 6 percent by weight, of these supplementary solvents is added. It is believed that these organic solvents do not participate at all, or participate to only a minor degree, in the developing process itself; they mainly serve the purpose of keeping the developer humid, or of plasticizing it when it becomes dry on the application plush pads, rods or brushes in the developing machines.

The developer mixtures according to the present invention are very well suited for use with a great number of different light-sensitive layers, as even in the finest halftone areas they lead to an immediate swelling and complete dispersion of the unhardened layer component parts, without attacking or damaging the hardened layer component parts. No formation of disturbing cakes, nor any redeposition in solid or fine halftone areas occurs. Quite obviously the hydrophilic/hydrophobic copolymer causes a better and more stable dispersion of the layer constituents which are not molecularly dissolved.

If developers are manufactured without any copolymers, additional surfactants are necessary to solubilize the solvent in water, which may lead to strong, disturbing foaming or make the developer too aggressive. Developers of this kind are also able to make the unhardened layer component parts swell and to remove them, but in many cases they cannot prevent the coagulation and flocculation of insoluble component parts, and redepositions are the result. If on the other hand no solvent is used in the developer mixture according to this invention, whereas the polymeric component parts are contained therein, the capacity of the developer to cause swelling is not sufficient. Such a developer is ineffective.

The developer mixtures according to the present invention are preferably used for negative working layers mainly comprising a diazo polycondensate and a water-insoluble polymeric binder. Exposed photopolymerizable copying layers may also be developed with these mixtures. Appropriate binders for such layers are polymeric vinyl esters, e.g. polyvinyl acetate, polyvinyl propionate, polyvinyl benzoate, polyvinyl isoionanate, polyvinyl versatate, polyvinyl chloride, polyvinylidene chloride and partially saponified derivatives of these polymers; polymeric acrylic and methacrylic acid esters, wherein the alcohol component part may have between 1 and 20 carbon atoms; polyvinyl acetals, such as polyvinyl formal, polyvinyl butyral, and polyvinyl benzal, which in addition may contain different quantities of OH— and acetate groups; copolymers of the above groups of substances, e.g., with crotonic acid, maleic acid esters and fumaric acid esters, acrylic acid and methacrylic acid; homopolymers of styrene or copolymers with the above monomers; modified and non-modified epoxide resins, e.g. resins whose free epoxide groups have been reacted with organic or inorganic acids; phenol-formaldehyde resins and cresol-formaldehyde resins, urea-formaldehyde resins, melamine-formaldehyde resins, polyurethane resins, both branched and unbranched, and also polyurethanes with terminal isocyanate groups; copolymers comprising reactive monomers, such as N-methylol acrylamide or acetoacetyl ethyl acrylate, and vinyl esters, acrylates, methacrylates and the like, alkyd resins, polyamide resins, polycarbonates and polyethylene resins, including those which are modified with carboxy groups.

It is known how to combine such binders with light-sensitive component parts to form light-sensitive layers. In general, these layers also contain pigments, dyes, indicators, acids, plasticizers, water-soluble polymers, surfactants, and the like. These additives are also known. Suitable layers are, e.g., described in German Offenlegungsschrift Nos. 2,024,244, 2,034,654, 2,034,655, 2,039,861, 2,331,377, 2,739,774, 2,822,887, and 2,834,059, and in U.S. Pat. No. 3,660,097.

Suitable layer supports are in general materials which are commonly used for printing plates, such as paper, plastic films, aluminum, copper, zinc, steel, and the like. Special preference is given to aluminum which for this purpose usually is roughened mechanically, chemically, or electrochemically, and then possibly oxidized anodically. A further treatment of this carrier material with polyvinyl phosphonic acid, phosphate, silicate, hexafluorozirconate, chromate, borate, polyacrylamide, cellulose derivatives and the like may be advantageous.

Besides their good developing effect, the mixtures according to this invention have other advantageous qualities which can be utilized when processing light-sensitive printing plates. So it is possible to leave the mixtures on the plate surface after developing and to let them dry or to dry them, e.g. by rubbing. In this case they act as preserving agents for the plate surface, so that no additional preserving agent, e.g. gum arabic, is necessary.

Another advantage of these mixtures is that they effectively prevent the deposition of insoluble resins in developing machines. In known developers such depositions cause serious problems if they occur at inaccessible points of the machine. The mixtures according to this invention are even able to remove old such depositions from machines, without contaminating or damaging the printing plate which at the same time is developed. Thus these mixtures may also be used as cleansing agents for all kinds of materials, in order to remove hydrophobic water-insoluble contaminations, e.g. fatty matter, resins, silicones, dyes, and the like.

In the following examples preferred embodiments of the invention are described. Quantity relative numbers, percentages and parts mean units by weight, if not indicated otherwise. The surface tensions were measured at 25° C.

EXAMPLE 1

1 g of a polycondensate of 1 mole of 3-methoxy diphenyl amine-4-diazonium chloride and 1 mole of 4,4'-bis-methoxymethyl diphenyl ether, separated as mesitylene sulfonate, 4 g of a copolymer of vinyl acetate and dibutyl maleinate, 0.4 g of malachite green (C.I. 42,000), 0.1 g of phosphoric acid (85%) and 0.1 g of metanil yellow (C.I. 13,065) were dissolved in 150 ml of ethylene glycol monomethyl ether and 50 ml of tetrahydrofuran, and applied upon a layer support such that the dried layer had a weight of 0.8 g/m². The layer support consisted of electrochemically roughened and anodically oxidized aluminum of an oxide weight of 3 g/m², and had been after-treated with an aqueous solution of polyvinyl phosphonic acid.

Under a negative original, the offset printing plate which had been obtained was exposed to light by means of a 5000 W metal halide lamp in a conventional exposure device for 30 seconds, and then developed by pouring on a mixture of 100 g of water, 4.5 g of 4-phenyl butanol-2, 5 g of a copolymer of N-vinyl-N-methyl acetamide and dioctyl maleinate (88:12), 0.5 g of phosphoric acid (85%), 0.2 g of sodium octylsulfate and 3 g of magnesium sulfate. An 0.1% aqueous solution of the copolymer had a surface tension of 33 mN/m. After rinsing with water the plate was ready for use in a printing press. Neither on solid areas nor on fine halftone or line elements redepositions or undeveloped layer remainders were found.

Upon another plate which had been developed in the same way fresh developer solution was poured after rinsing, then the plate was rubbed dry with a pad. After 4 weeks the plate was again rinsed with water, and it showed the same printing behavior as the plate which had been used immediately after developing.

For comparative reasons Example 1 was repeated, except that the copolymer in the developer was replaced by the same quantity of poly-N-vinyl-N-methyl acetamide. The developing effect was practically the same, but on fine halftone areas and on solid areas of the image considerable quantities of oleophilic flocculated matter were redeposited. An 0.1% aqueous solution of the homopolymer had a surface tension of 60 mN/m.

EXAMPLE 2

1 g of a polycondensate of 1 mole of 3-methoxydiphenyl amine-4-diazonium chloride and 1 mole of 4,4'-bis-methoxymethyl diphenyl ether, separated as methane sulfonate, 8 g of a copolymer of butyl acrylate and vinyl acetate (molar ratio 1:1), 0.3 g of Victoria Pure Blue ® FGA (C.I. Basic Blue 81), and 0.2 g of phosphoric acid (85%) were dissolved in 200 ml of ethylene glycol monomethyl ether and applied upon an aluminum support such that the weight of the dry layer was 1 g/m². The layer support had been roughened by brushing with an aqueous abrasive slurry and then treated with an aqueous solution of polyvinyl phosphonic acid. After the imagewise exposure according to the procedure in Example 1, developing was effected with a mixture of 100 g of water, 10 g of octanol-1, 1.5 g of sodium octyl sulfate, 0.4 g of sodium metasilicate, 3 g of a water-soluble copolymer of N-vinyl-N-methyl acetamide and ethene sulfonic acid (molar ratio 3:2), and 3 g of a copolymer of N-vinyl-N-methyl acetamide and 2-ethyl hexylacrylate (91:9).

EXAMPLE 3

1 g of the diazo polycondensate of Example 1, 4 g of an aqueous 50% polyvinyl butyral dispersion, 5 g of a pigment dispersion—composed of 10% of a β-Cu-phthalocyanin (C.I. 74,160), 10% of polyvinyl formal and 80% of ethylene glycol methyl ether acetate—and 0.2 g of methyl orange were dissolved in 80 g of cyclohexanone and 40 g of tetrahydrofuran, and applied onto the layer support described in Example 1 following the procedure described therein. Developing was effected with a solution of 100 g of water, 7 g of m-methoxy benzyl alcohol, 6 g of a copolymer of vinyl alcohol, vinyl acetate and vinyl versatate (molar ratio 94:5:1), 1.1 g of sodium octylsulfate and 2 g of phosphoric acid (85%). The printing plate thus obtained delivered a very high number of prints in the press. An 0.1% aqueous solution of the copolymer had a surface tension of 44 mN/m.

EXAMPLE 4

1.15 g of the diazo polycondensate of Example 1, 3.45 g of a copolymer of methyl methacrylate and methacrylic acid having an acid number of 110, 1 g of the pigment dispersion described in Example 3, 0.1 g of phosphoric acid (85%), and 0.04 g of metanil yellow were dissolved in 100 g of ethylene glycol monomethyl ether and applied onto the layer support described in Example 2 such that the weight of the dry layer was 0.8 g/m². After the imagewise exposure, development was effected with a solution of 5 parts of benzyl alcohol, 4 parts of phosphoric acid (85%), 5 parts of the copolymer of N-vinyl-N-methyl acetamide ad 1 part of sodium octyl sulfate described in Example 1, in 100 parts of water. The result was a perfectly developed printing plate which in a sheet-fed offset press delivered 20,000 to 30,000 good prints.

EXAMPLE 5

2.4 g of the diazocondensate of Example 1, 28.8 g of a 65% solution of a non-plasticized urea resin (in butanol) of medium viscosity, 0.45 g of phosphoric acid (85%), and 1.2 g of Victoria Pure Blue FGA ® (C.I. Basic Blue 81) were dissolved in 300 ml of ethylene glycol monomethyl ether and applied upon the layer support described in Example 2 such that the weight of the dry layer was 1.4 g/m². After the imagewise exposure, developing was effected rapidly and without the formation of cakes with a mixture of 100 parts of water, 5 parts of o-methoxybenzyl alcohol, 3 parts of the copolymer described in Example 1, 2 parts of phosphoric acid (85%), and 1 part of sodium octyl sulfate.

EXAMPLE 6

8 g of a water-dilutable 50% solution of an alkyd resin of medium oiliness based on drying fatty acids having an acid number of 45 in butanol (dynamic viscosity of the solution of 20° C. between 160 and 250 mPa.s), 2 g of the diazocondensate described in Example 1, 0.2 g of phosphoric acid (85%) and 0.3 g of fuchsin (C.I. 42,510) were dissolved in 150 ml of ethylene glycol monomethyl ether and 50 ml of tetrahydrofuran, and applied upon the layer support described in Example 2 such that the weight of the dry layer was 1 g/m². After the imagewise exposure developing was effected rapidly and completely in a solution of 4 parts of 1-phenyl ethanol, 0.3 parts of sodium metasilicate, 2 parts of a sodium fatty alcohol polyglycol ether sulfate and 3 parts of a copolymer of N-vinyl-N-methyl acetamide and 2-ethyl hexyl acrylate (91:9), 3 parts of trisodium phosphate, and 100 parts of water.

EXAMPLE 7

1.15 g of the diazo condensation product described in Example 1, 3.45 g of an essentially linear polyurethane, prepared from 4,4'-diphenyl methane diisocyanate and a polyester diol of adipic acid and butane diol-1,4, 1 g of the pigment dispersion described in Example 3, 0.04 g of metanil yellow, and 0.1 g of phosphoric acid (85%) were dissolved in 100 ml of ethylene glycol monomethyl ether and applied upon the layer support described in Example 2 such that the weight of the dry layer was 1 g/m². After the imagewise exposure, developing was effected with a mixture of 83 g of water, 5 g of 4-phenyl butanol-1, 1 g of sodium octyl sulfate and 5 g of the copolymer described in Example 1. A properly developed printing plate was obtained which in a sheet-fed offset press delivered about 15,000 perfect prints.

EXAMPLE 8

3 g of polyvinyl formal of a molecular weight of about 30,000, a hydroxyl group content of 6 percent and an acetate group content of 26 percent, 1 g of the diazocondensate described in Example 2, 0.3 g of phosphoric acid (85%), 0.4 g of Victoria Pure Blue FGA ®, and 0.2 g of metanil yellow were dissolved in 100 ml of ethylene glycol monomethyl ether and applied upon the layer support described in Example 2 such that the weight of the layer was 0.5 g/m². After the imagewise exposure, developing was effected with the developer described in Example 4, except that the benzyl alcohol was replaced by the same quantity of 2-phenoxy ethanol, and an unobjectionable printing plate was obtained.

EXAMPLE 9

The same process as in Example 7 was employed, the only difference being that instead of the polyurethane binder, the same quantity of a mixture containing a non-plasticized urea resin of medium viscosity in the form of a 65% solution in butanol (viscosity of the commercial quality=3,000 to 3,600 mPa.s at 20° C.), was employed with a non-modified epoxide resin having a softening point of between 65° and 75° C. and an epoxide equivalent weight of between 450 and 525. The proportion by weight of the resins was 1:1, based on solid matter. On the layer support described in Example 2 a layer was obtained which after the imagewise exposure was developed with the developer described in Example 7 and delivered about 15,000 good prints in an offset press.

EXAMPLE 10

8 g of a 50% solution of an acrylic resin containing hydroxyl groups (content of hydroxyl groups 4.8%) in xylene/ethylene glycol ethyl ether acetate (2:1) having a dynamic viscosity of 1,550 mPa.s at 25° C., 2 g of a 56% aqueous dispersion of a copolymer of vinyl acetate and butyl acrylate (molar ratio 1:1), 2 g of the diazo condensate described in Example 1, 0.5 g of malachite green, 0.2 g of phosphoric acid (85%), and 0.2 g of methyl orange were dissolved in 150 ml of ethylene glycol monomethyl ether and 50 ml of tetrahydrofuran and applied onto the layer support described in Example 1 such that the weight of the dry layer was 1.3 g/m². After the imagewise exposure, development was effected with an aqueous solution of 5% of a copolymer of N-methyl-N-vinyl acetamide and 2-ethyl hexyl acrylate (91:9), 5% of m-methoxy benzyl alcohol, 0.2% of sodium octyl sulfate and 2% of phosphoric acid (85%). An unobjectionably developed printing plate was obtained.

EXAMPLE 11

8 g of an epoxide resin with an epoxide equivalent weight of between 450 and 525, 2 g of a condensation product of diphenylamine-4-diazonium chloride and formaldehyde, separated as 2-hydroxy-3-methoxy benezophenone-4-sulfonate, 0.2 g of phosphoric acid (85%) and 0.3 g of fuchsine were dissolved in 200 ml of a mixture of ethylene glycol monomethyl ether and tetrahydrofuran (3:1) and applied onto a layer support such that the weight of the layer was 1 g/m². The layer support was an aluminum foil whose surface had been roughened with a wire brush and then treated with an aqueous solution of polyvinyl phosphonic acid. After the imagewise exposure, developing was effected with a mixture of 100 g of water, 5 g of 2-phenyl ethanol, 5 g of a copolymer of N-vinyl-N-methyl acetamide and octylacrylate (91:9) and 0.3 g of sodium metasilicate.

EXAMPLE 12

1.15 g of the diazopolycondensate described in Example 1, 3.45 g of a polyurethane prepolymer with terminal free isocyanate groups, which was prepared from 8 moles of 2,4-tolylene diisocyanate, 1 mole of butane diol-1,4, 1 mole of polypropylene glycol (molar weight=1,000) and 2 moles of 1,1,1-trimethylol propane, 1.0 g of the pigment dispersion of Example 3, 0.04 g of metanil yellow, and 0.2 g of phosphoric acid (85%) were dissolved in 100 ml of ethylene glycol monomethyl ether and applied onto the layer support described in Example 2 such that the weight of the dry layer was 1 g/m². After the imagewise exposure, developing was effected with the developer described in Example 7, and an unobjectionably developed printing plate was obtained which delivered about 60,000 good prints.

EXAMPLE 13

10 g of a 50% aqueous dispersion of a terpolymer of ethylene, vinyl acetate and vinyl chloride, 1.5 g of the diazocondensate of Example 1, 0.3 g of phosphoric acid (85%), and 0.1 g of Victoria Pure Blue FGA ® were dissolved in 100 ml of a mixture of ethylene glycol monomethyl ether, tetrahydrofuran and butyl acetate (4:5:1) and applied onto the layer support described in Example 1 in such a way that the weight of the dry layer was 1.3 g/m². After the imagewise exposure, developing was effected with an aqueous solution of 7% of a copolymer of N-vinyl-N-methyl acetamide and bis-(2-ethyl-hexyl) maleinate (88:12), 2% of phosphoric acid, 1% of magnesium sulfate, and 6% of 4-methoxy benzyl alcohol and 3% of ethylene glycol, and an unobjectionably developed printing plate was obtained.

Unobjectionable developing of the printing plate was also possible in a conventional developing machine which previously had been run with a conventional developer over a longer period. At the difficultly accessible parts of the machine, residues of water-insoluble condensation resins or polyvinyl resins had settled. These residues were removed by the developer according to the present invention without any noticeable adverse influence on the quality of the developed plate.

EXAMPLE 14

6 g of an aqueous dispersion of a terpolymer of vinyl acetate, vinyl versatate and butyl acrylate (50% solids), 0.4% of malachite green, 0.2 g of phosphoric acid and 1 g of the diazocondensate described in Example 2 were dissolved in 150 ml of a mixture of cyclohexanone, tetrahydrofuran and butyl acetate (5:4:1) and were applied onto the aluminum layer support described in Example 1 such that the weight of the dry layer was 0.7 g/m². After the imagewise exposure, developing was effected with an aqueous solution containing 7% of 3-phenyl propanol-1, 3.8% of a copolymer of 2-ethyl hexylacrylate and N-vinyl-N-methyl acetamide (91:9), 3% of phosphoric acid (85%), and 0.5% of sodium lauryl sulfate. An unobjectionably developed printing plate was obtained which in a sheet-fed offset printing press delivered more than 100,000 good prints.

EXAMPLE 15

A solution of 1.4 g of a copolymer of methyl methacrylate and methacrylic acid having an acid number of 105, 1.4 g of trimethylol ethane triacrylate, 0.4 g of 1,6-dihydroxyethoxy hexane and 0.05 g of benz-(a)-acridine in 13 g of ethylene glycol monoethyl ether was filtered and applied onto electrolytically roughened and anodically oxidized aluminum having an oxide layer weight of 3 g/m² such that after drying a layer weight of 5 g/m² was obtained.

After the imagewise exposure of the plate, developing was effected with a solution of 3.0 g of sodium metasilicate, 0.05 g of strontium chloride, 0.03 g of sodium lauryl sulfate, 2 g of a copolymer of N-vinyl-N-methyl acetamide and octylacrylate (91:9), and 3 g of 2-phenoxy ethanol in 100 g of water. An 0.1% strength solution of the copolymer had a surface tension of 39 mN/m. An unobjectionably developed offset printing form was obtained which delivered more than 100,000 good prints.

EXAMPLE 16

8 g of a plasticized dispersion of polyvinyl acetate (solids 60%) having a cellulose ether as protective colloid, 1 g of a 40% dispersion of Pigment Green 7 (C.I. 74,260) in ethylene glycol/water (3:1), 1 g of the diazocondensate of Example 1 and 0.3 g of phosphoric acid (85%), were dissolved in 100 ml of ethylene glycol monomethyl ether and applied onto an electrochemically roughened aluminum layer support which had been treated with a sodium silicate solution, such that the weight of the dry layer was 1 g/m². After the imagewise exposure, developing was effected with the following developer: 100 g of water, 2.8 g of the copolymer described in Example 1, 4.5 g of 2-phenyl-1-butanol and 5 g of disodium phosphate. The plate could be developed rapidly and without the formation of cakes, and delivered many thousands of good prints in a printing press.

EXAMPLE 17

0.76 g of the esterification product of 1 mole of 2,3,4-trihydroxy benzophenone and 3 moles of naphthoquinone-(1,2)-diazide-(2)-5-sulfonic acid chloride, 0.58 g of the esterification product of 1 mole of 2,2'-dihydroxy dinaphthyl-(1,1')-methane and 2 moles of naphthoquinone-(1,2)-diazide-(2)-5-sulfonic acid chloride, 0.19 g of naphthoquinone-(1,2)-diazide-(2)-4-sulfonic acid chloride, 5.85 g of a cresol-formaldehyde novolak having a softening point between 105° and 120° C., and 0.07 g of Crystal Violet (C.I. 42,555) were dissolved in a mixture of 40 g of ethylene glycol monomethyl ether, 50 g of tetrahydrofuran and 10 g of butyl acetate. The solution was applied onto the aluminum support described in Example 1, such that the weight of the dry layer was 1.0 g/m². After the imagewise exposure, developing was effected with an aqueous solution containing 4% of benzyl alcohol, 2% of a triethanolamine, 3% of the copolymer described in Example 1, 3% of sodium sulfate, 0.2% of sodium metasilicate, 2% of tertiary sodium phosphate, and 1% of sodium octyl sulfate. An unobjectionable printing plate was obtained which in a sheet-fed offset press delivered more than 100,000 good prints.

EXAMPLE 18

3 g of the diazocondensate described in Example 1, 1 g of a pigment powder prepared from β-Cu-phthalocyanine and polyvinyl butyral (1:1), 1 g of phosphoric acid and 0.1 g of metanil yellow were dissolved in 100 ml of ethylene glycol monomethyl ether and applied onto a layer support such that the weight of the layer was 0.5 g/m². The only difference between the layer support used in this example and that described in Example 1 was its lower oxide weight of 2 g/m². After the imagewise exposure, the plate was dipped into a cuvet containing the developer described in Example 10. After about ½ minute the plate was removed and given a short rinse with water. From the printing plate processed in this way, about 100,000 sheets could be printed in a press having an alcohol damping unit.

EXAMPLE 19

6 g of an aqueous 50% dispersion of a terpolymer of ethylene, vinyl acetate and vinyl chloride, 1.5 g of the diazo polycondensate described in Example 1, 0.08 g of phosphoric acid (85%), 0.16 g of Victoria Pure Blue FGA ®, and 0.11 g of metanil yellow were dissolved in a mixture of 116 g of ethylene glycol monomethyl ether, 59 g of tetrahydrofuran and 17 g of butyl acetate and applied onto the layer support described in Example 1 such that the weight of the dry layer was 0.8 g/m². After the imagewise exposure, developing was effected with an aqueous solution of 2.9% of a copolymer of N-methyl-N-vinyl acetamide and bis-(2-ethyl hexyl)-maleinate (88:12), 3% of disodium hydrogen phosphate, 4.3% of benzyl alcohol, 0.2% of sodium octyl sulfate and 4.0% of diethylene glcyol, and an unobjectionable printing plate was obtained which in a sheet-fed offset press delivered more than 100,000 good prints.

It will be obvious to those skilled in the art that many modifications may be made within the scope of the present invention without departing from the spirit thereof, and the invention includes all such modifications.

What is claimed is:

1. A developer mixture for washing out light-sensitive copying layers previously exposed in imagewise manner and containing a polymer of an N-vinyl amine, of vinyl alcohol or of a vinyl alcohol derivative, an alcohol being water-soluble in an amount less than 10 percent by weight, and water as the main constituent, the mixture containing 1 to 15 percent by weight of said alcohol and 0.5 to 10 percent by weight of said polymer, said polymer is a copolymer which is water-soluble or which can be dispersed in water to form a stable dispersion, composed of (a) hydrophilic units of the formula I

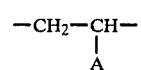

wherein

A is O-R or

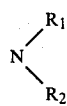

R is a hydrogen atom or a methyl group, $R_1$ is a hydrogen atom or an alkyl group having 1 to 5 carbon atoms, $R_2$ is an acyl group having 1 to 4 carbon atoms, a homopolymer of the hydrophilic units being water-soluble, and of (b) hydrophobic units of vinyl monomers whose homopolymer is water-insoluble and which have an aromatic or a long-chain aliphatic group as the substituent and which are derived from alkyl esters of unsaturated carboxylic acids having alkyl groups with 4 to 30 carbon atoms, from vinyl aromatic compounds or from vinyl esters of aliphatic carboxylic acids having 4 to 30 carbon atoms, the proportion of the hydrophobic units being sufficient to ensure that an 0.1 percent aqueous solution of said copolymer has a surface tension of not more than 50 mN/m, the quantity of said copolymer being at least sufficient to emulsify any quantity of alcohol exceeding the solubility limit and the upper limit being reached when the viscosity of said developer mixture has a viscosity value of 0.2 cm$^2$/s at 25° C., measured by the Ubbelohde method.

2. A developer mixture according to claim 1 which additionally contains 0.05 to 5% by weight of an ionic wetting agent.

3. A developer mixture according to claim 1 which additionally contains 0.1 to 10% by weight of a salt.

4. A developer mixture according to claim 1 which additionally contains 0.1 to 8% by weight of an acid.

5. A developer mixture according to claim 1 which additionally contains 0.1 to 10% by weight of a polyvalent alcohol which may be partially etherified or esterified and which is water-soluble to at least 10% by weight, or of a water-insoluble completely etherified or esterified polyvalent alcohol.

* * * * *